United States Patent
Masuo

(10) Patent No.: US 7,042,793 B2
(45) Date of Patent: May 9, 2006

(54) SEMICONDUCTOR MEMORY DEVICE

(75) Inventor: Akira Masuo, Amagasaki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 11/143,659

(22) Filed: Jun. 3, 2005

(65) Prior Publication Data
US 2005/0270885 A1    Dec. 8, 2005

(30) Foreign Application Priority Data
Jun. 3, 2004    (JP) .............................. 2004-165615

(51) Int. Cl.
*G11C 8/00*    (2006.01)

(52) U.S. Cl. ............................. 365/230.05; 365/230.01; 365/230.06

(58) Field of Classification Search ........... 365/230.05, 365/230.01, 230.06
See application file for complete search history.

(56) References Cited

U.S. PATENT DOCUMENTS

| 6,181,634 B1 | 1/2001 | Okita | |
| 6,288,969 B1 * | 9/2001 | Gibbins et al. | 365/230.05 |
| 2005/0083765 A1 * | 4/2005 | Jeong et al. | 365/230.05 |

FOREIGN PATENT DOCUMENTS

JP    10-21687    1/1998

* cited by examiner

*Primary Examiner*—Richard Elms
*Assistant Examiner*—N Nguyen
(74) *Attorney, Agent, or Firm*—McDermott Will & Emery LLP

(57) ABSTRACT

A column switch in a two-port SRAM (static random access memory) is provided with A-port switches, B-port switches, and inter-port switches. When it is detected that an A-port row address and a B-port row address match each other, all of the B-port switches are turned off, and an A-port bit line pair for a column selected according to A-port column decode signals is coupled to an A-port data line pair, while an A-port bit line pair for a column selected according to B-port column decode signals is coupled to a B-port data line pair.

3 Claims, 4 Drawing Sheets

SEMICONDUCTOR MEMORY DEVICE

CROSS-REFERENCE TO RELATED APPLICATION

This application is related to Japanese Patent Application No. 2004-165615 filed on Jun. 3, 2004, whose priority is claimed under 35 USC §119, the disclosure of which is incorporated herein by reference in its entirety.

BACKGROUND OF THE INVENTION

The present invention relates to a multiport semiconductor memory device.

In terms of realizing high-speed access, SRAMs (static random access memories) are suitable as cache memories in microprocessors or the like. Two-port SRAMs are particularly suited for high-speed operation, because their two ports can be operated independently at the same time.

In a prior art two-port SRAM, a selector is provided outside first- and second-port input/output circuits. When requests to read data from the same memory cell are made at a time, the data is read through the first port, while the selector makes the second port also output the data read through the first port, thereby preventing decrease in data read speed and malfunctions (see Japanese Laid-Open Publication No. 10-21687).

In this prior art, however, how to deal with column addresses is unknown. More specifically, when data in memory cells in the same row but in different columns of the memory cell array in the two-port SRAM are requested to be read at the same time, it is not ensured that the correct data is output from each port.

SUMMARY OF THE INVENTION

It is therefore an object of the present invention to ensure that correct data is always output, while preventing decrease in data read speed and malfunctions, in a multiport semiconductor memory device.

In order to achieve the object, an inventive semiconductor memory device includes: a memory cell array in which a plurality of memory cells are arranged two-dimensionally in a plurality of rows and a plurality of columns, each of the memory cells having first- and second-port word lines and first- and second-port bit line pairs; a first row decoder for driving the first-port word line of memory cells in a row selected from the plurality of rows in the memory cell array according to a first-port row address; a second row decoder for driving the second-port word line of memory cells in a row selected from the plurality of rows in the memory cell array according to a second-port row address; a row address comparison circuit for detecting whether or not the first-port row address and the second-port row address match each other and controlling the first and second row decoders in such a manner that when it is detected that the row addresses do not match each other, the first and second row decoders are both operated, and when it is detected that the row addresses match each other, only the first row decoder is operated; and a column switch interposed between a set of the first-port bit line pairs and the second-port bit line pairs, each of which is shared by memory cells in a corresponding one of the columns in the memory cell array, and a set of a first-port data line pair and a second-port data line pair, each of which is shared by all of the columns in the memory cell array. When the row address comparison circuit detects that the first-port row address and the second-port row address do not match each other, the column switch connects, to the first-port data line pair, the first-port bit line pair of memory cells in a column selected from the plurality of columns in the memory cell array according to a first-port column address, and connects, to the second-port data line pair, the second-port bit line pair of memory cells in a column selected from the plurality of columns in the memory cell array according to a second-port column address. When the row address comparison circuit detects that the first-port row address and the second-port row address match each other, the column switch connects, to the first-port data line pair, the first-port bit line pair of the memory cells in the column selected from the plurality of columns in the memory cell array according to the first-port column address, and connects, to the second-port data line pair, the first-port bit line pair of the memory cells in the column selected from the plurality of columns in the memory cell array according to the second-port column address.

In the inventive device, when it is detected that the first-port row address and the second-port row address match each other, of the first-port word line and the second-port word line for the selected row, only the first-port word line is driven, thereby preventing decrease in data read speed and malfunctions as in the prior art. In addition, when it is detected that the first-port row address and the second-port row address match each other, the column switch connects to the first-port data line pair the first-port bit line pair of the memory cells in a column selected from the plurality of columns in the memory cell array according to the first-port column address, and connects to the second-port data line pair the first-port bit line pair of the memory cells in a column selected from the plurality of columns in the memory cell array according to the second-port column address. Therefore, even in a case where requests to read data from memory cells in the same row but in different columns are made at a time, it is ensured that the correct data is output from each port.

DESCRIPTION OF THE PREFERRED EMBODIMENTS

Hereinafter, a preferred embodiment of the present invention will be described in detail with reference to the accompanying drawings.

Figure 1:
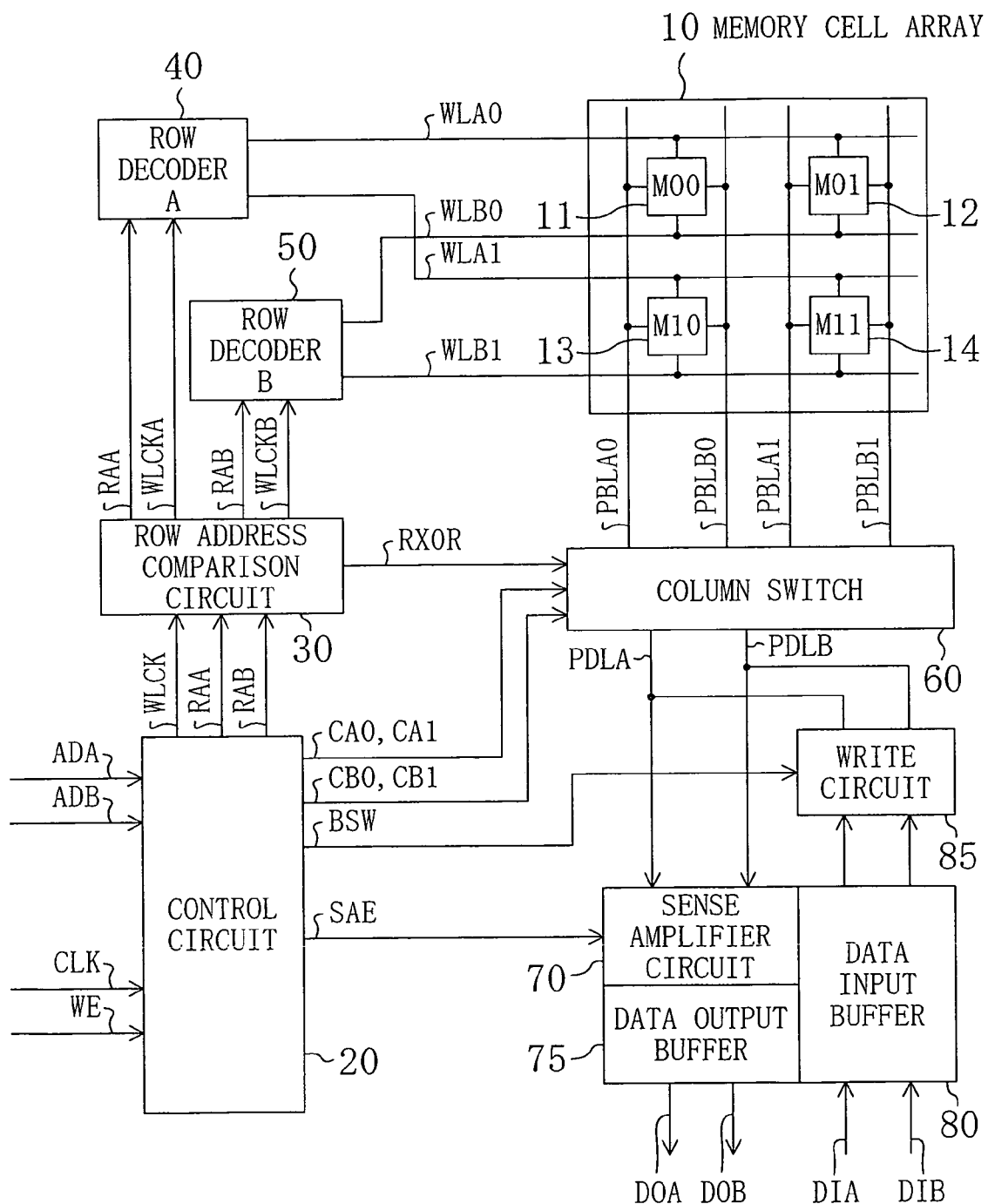
FIG. 1 is a block diagram illustrating an exemplary configuration of a two-port SRAM, which is an embodiment of a semiconductor memory device according to the present invention.

FIG. 1 illustrates an exemplary configuration of a two-port SRAM, which is an embodiment of a semiconductor memory device according to the present invention. In FIG. 1, the reference numeral 10 refers to a memory cell array; 20 to a control circuit; 30 to a row address comparison circuit; 40 to an A-port row decoder; 50 to a B-port row decoder; 60 to a column switch; 70 to a sense amplifier circuit; 75 to a data output buffer; 80 to a data input buffer; and 85 to a write circuit. Herein, for the sake of simplicity, it is assumed that the memory cell array 10 is composed of four memory cells 11, 12, 13, and 14 arranged two-dimensionally in two rows and two columns.

In the memory cell array 10, the memory cell (M00) 11 in the first row and the first column has an A-port word line WLA0 and a B-port word line WLB0 both specified by a row address 0, and an A-port bit line pair PBLA0 and a B-port bit line pair PBLB0 both specified by a column address 0. The memory cell (M01) 12 in the first row and the second column shares the A-port word line WLA0 and the B-port word line WLB0 with the memory cell (M00) 11 in the first row and the first column, while having an A-port bit line pair PBLA1 and a B-port bit line pair PBLB1 both specified by a column address 1. The memory cell (M10) 13 in the second row and the first column has an A-port word line WLA1 and a B-port word line WLB1 both specified by a row address 1, while sharing the A-port bit line pair PBLA0 and the B-port bit line pair PBLB0 with the memory cell (M00) 11 in the first row and the first column. The memory cell (M11) 14 in the second row and the second column shares the A-port word line WLA1 and the B-port word line WLB1 with the memory cell (M10) 13 in the second row and the first column, and shares the A-port bit line pair PBLA1 and the B-port bit line pair PBLB1 with the memory cell (M01) 12 in the first row and the second column. In other words, in each of the A and B ports, the memory cell (M00) 11 in the first row and the first column can be specified by a 2-bit address 00, the memory cell (M01) 12 in the first row and the second column can be specified by a 2-bit address 01, the memory cell (M10) 13 in the second row and the first column can be specified by a 2-bit address 10, and the memory cell (M11) 14 in the second row and the second column can be specified by a 2-bit address 11.

The A-port row decoder 40 can drive either the A-port word line WLA0 specified by the A-port row address 0 or the A-port word line WLA1 specified by the A-port row address 1. The B-port row decoder 50 can drive either the B-port word line WLB0 specified by the B-port row address 0 or the B-port word line WLB1 specified by the B-port row address 1.

The control circuit 20 receives an A-port address input signal ADA, a B-port address input signal ADB, a clock signal CLK, and a write enable signal WE, while the control circuit 20 supplies an A-port row address signal RAA, a B-port row address signal RAB, and a word line clock signal WLCK to the row address comparison circuit 30, supplies A-port column decode signals CA0 and CA1 and B-port column decode signals CB0 and CB1 to the column switch 60, supplies a sense amplifier enable signal SAE to the sense amplifier circuit 70, and supplies a write switch signal BSW to the write circuit 85.

In the control circuit 20, the A-port address input signal ADA (2 bits) is separated into the row address signal RAA (the higher-order one bit of ADA) and a column address signal (the lower-order one bit of ADA). The A-port column decode signals CA0 and CA1 represent decoding results of the column address signal. More specifically, when the column address designated for the A-port is 0, CA0=1 and CA1=0, and when the column address designated for the A-port is 1, CA0=0 and CA1=1.

Similarly, the B-port address input signal ADB (2 bits) is separated in the control circuit 20 into the row address signal RAB (the higher-order one bit of ADB) and a column address signal (the lower-order one bit of ADB). The B-port column decode signals CB0 and CB1 represent decoding results of the column address signal. More specifically, when the column address designated for the B-port is 0, CB0=1 and CB1=0, and when the column address designated for the B-port is 1, CB0=0 and CB1=1.

The row address comparison circuit 30 compares the A-port row address signal RAA with the B-port row address signal RAB to detect whether these row address signals match with each other or not, and generates a row address disagreement signal RXOR. When the equation RAA=RAB holds, RXOR=0, and when the equation RAA=RAB does not hold, RXOR=1. The produced row address disagreement signal RXOR is supplied to the column switch 60. Upon detection of a disagreement between the A-port row address signal RAA and the B-port row address signal RAB (that is, when RXOR=1), the row address comparison circuit 30 supplies the A-port row address signal RAA and an A-port word line clock signal WLCKA to the A-port row decoder 40 for operation of the A-port row decoder 40, while supplying the B-port row address signal RAB and a B-port word line clock signal WLCKB to the B-port row decoder 50 for operation of the B-port row decoder 50. In response to this, the A-port row decoder 40 drives the A-port word line (i.e., WLA0 or WLA1) of the memory cells in the row selected according to the A-port row address signal RAA. The B-port row decoder 50 drives the B-port word line (i.e., WLB0 or WLB1) of the memory cells in the row selected according to the B-port row address signal RAB. On the other hand, upon detection of a match between the A-port row address signal RAA and the B-port row address signal RAB (that is, when RXOR=0), the row address comparison circuit 30 supplies the A-port row address signal RAA and the A-port word line clock signal WLCKA to the A-port row decoder 40 so as operate the A-port row decoder 40, while the row address comparison circuit 30 stops the supply of the B-port word line clock signal WLCKB to the B-port row decoder 50 so as to halt the operation of the B-port row decoder 50.

The column switch 60 is interposed between a set of the A-port bit line pairs PBLA0 and PBLA1 and the B-port bit line pairs PBLB0 and PBLB1, which are shared by the memory cells in the corresponding columns in the memory cell array, and a set of an A-port data line pair PDLA and a B-port data line pair PDLB, which are shared by all of the columns in the memory cell array 10. When the row address comparison circuit 30 detects that the A-port row address signal RAA and the B-port row address signal RAB do not match each other (i.e., when RXOR=1), the column switch 60 functions to connect to the A-port data line pair PDLA the A-port bit line pair (PBLA0 or PBLA1) of the memory cells in the column selected from the columns in the memory cell array 10 according to the A-port column decode signals CA0 and CA1 and to connect to the B-port data line pair PDLB the B-port bit line pair (PBLB0 or PBLB1) of the memory cells in the column selected from the columns in the memory cell array 10 according to the B-port column decode signals CB0 and CB1. When the row address comparison circuit 30 detects that the A-port row address signal RAA and the B-port row address signal RAB match each other (i.e., when RXOR=0), the column switch 60 also functions to connect to the A-port data line pair PDLA the A-port bit line pair (PBLA0 or PBLA1) of the memory cells in the column selected from the columns in the memory cell array 10 according to the A-port column decode signals CA0 and CA1 and to connect to the B-port data line pair PDLB the A-port bit line pair (PBLA0 or PBLA1) of the memory cells in the column selected from the columns in the memory cell array 10 according to the B-port column decode signals CB0 and CB1.

When activated by the sense amplifier enable signal SAE, the sense amplifier circuit 70 amplifies the respective potential differences between the A-port data line pair PDLA and between the B-port data line pair PDLB. The data output buffer 75 supplies an external device with an A-port output data signal DOA and a B-port output data signal DOB, which represent the results of the amplification by the sense amplifier circuit 70. The data input buffer 80, on the other hand, receives an A-port input data signal DIA and a B-port input data signal DIB from an external device. The write circuit 85, in response to the write switch signal BSW produced when the write enable signal WE is activated, couples the outputs of the data input buffer 80 to the A-port data line pair PDLA and the B-port data line pair PDLB.

Figure 2:
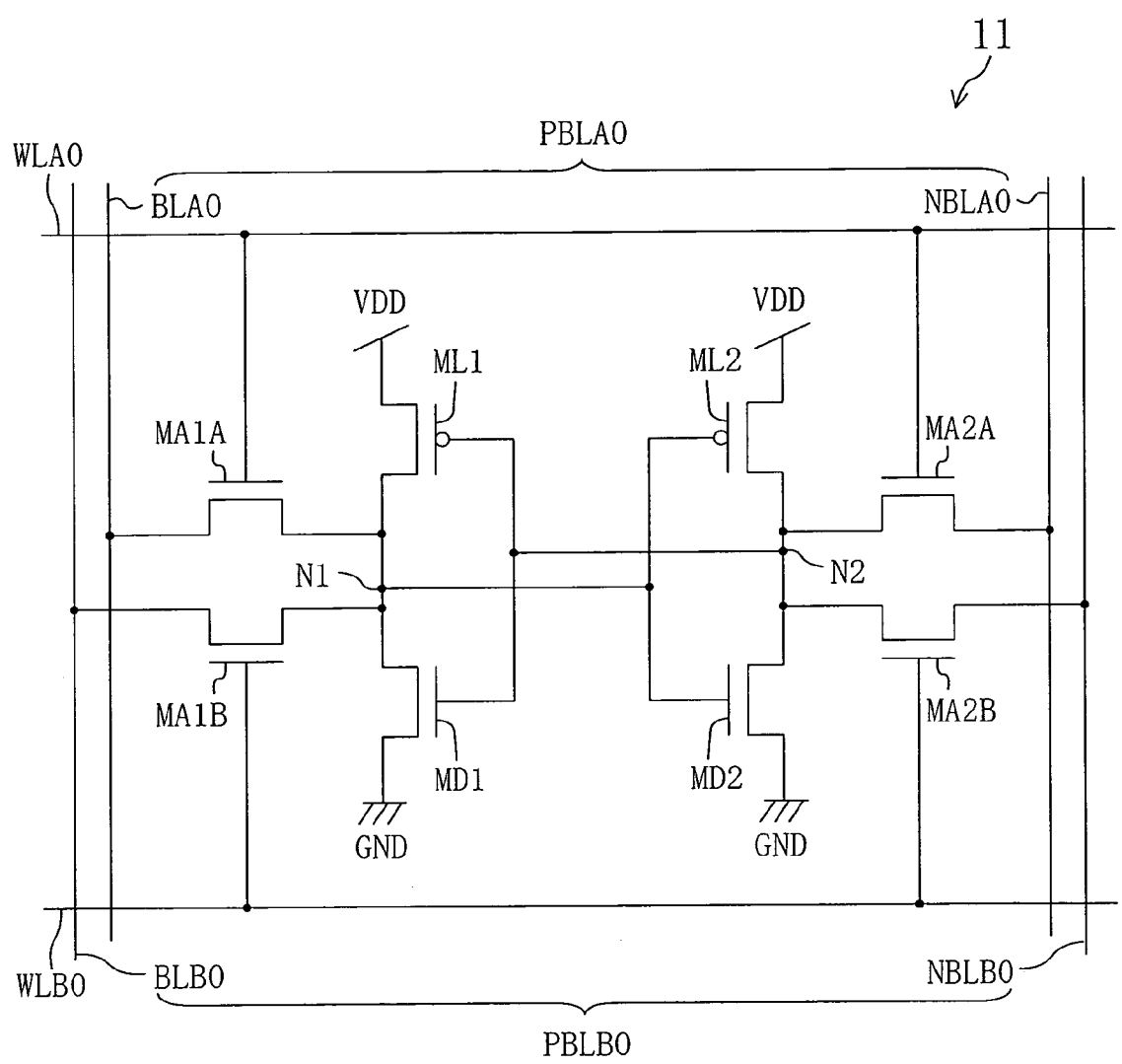
FIG. 2 is a circuit diagram illustrating the details of a memory cell included in a memory cell array shown in FIG. 1.

FIG. 2 illustrates an exemplary internal configuration of the memory cell 11 in the memory cell array 10. The other memory cells 12, 13, and 14 have a similar internal configuration. In FIG. 2, the memory cell 11 includes first and second inverters. The first inverter is composed of a first drive transistor (an N-channel MOS transistor) MD1 and a first load transistor (a P-channel MOS transistor) ML1, while the second inverter is composed of a second drive transistor (an N-channel MOS transistor) MD2 and a second load transistor (a P-channel MOS transistor) ML2. The output (a first storage node N1) of the first inverter is connected to the input of the second inverter, while the output (a second storage node N2) of the second inverter is connected to the input of the first inverter. The first storage node N1 is connected to an A-port noninverting bit line BLA0 and a B-port noninverting bit line BLB0 by way of a first A-port access transistor (an N-channel MOS transistor) MA1A and a first B-port access transistor (an N-channel MOS transistor) MA1B, respectively. The second storage node N2 is connected to an A-port inverting bit line NBLA0 and a B-port inverting bit line NBLB0 by way of a second A-port access transistor (an N-channel MOS transistor) MA2A and a second B-port access transistor (an N-channel MOS transistor) MA2B, respectively. The A-port noninverting bit line BLA0 and the A-port inverting bit line NBLA0 form the A-port bit line pair PBLA0 mentioned above, while the B-port noninverting bit line BLB0 and the B-port inverting bit line NBLB0 form the B-port bit line pair PBLB0. Furthermore, the respective gates of the first and second A-port access transistors MA1A and MA2A are connected to the A-port word line WLA0, while the respective gates of the first and second B-port access transistors MA1B and MA2B are connected to the B-port word line WLB0. As described above, since the A-port word line WLA0 and the B-port word line WLB0 of the memory cell 11 are not driven at the same time, a sufficient static noise margin is ensured without increasing the size of the two drive transistors MD1 and MD2 too much with respect to the four access transistors MA1A, MA2A, MA1B, and MA2B. It should be noted that VDD denotes a power supply voltage and GND represents a ground.

Figure 3:
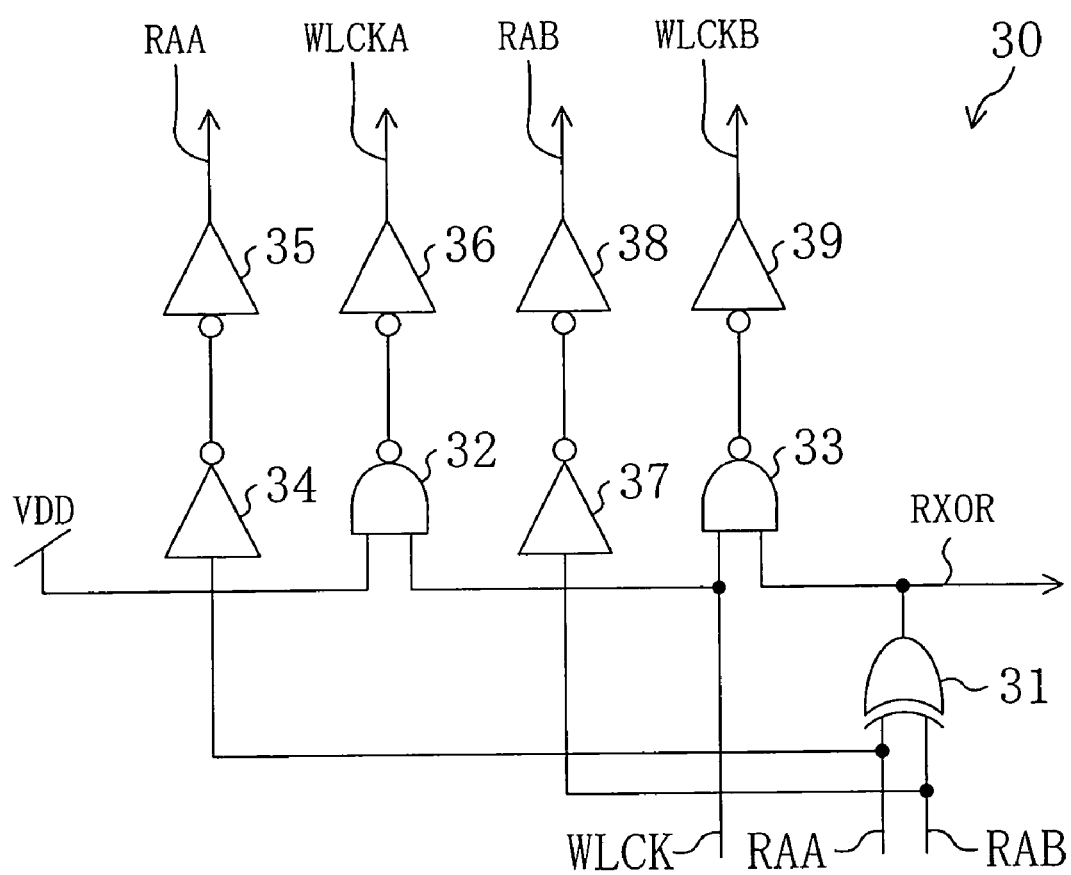
FIG. 3 is a circuit diagram illustrating the details of a row address comparison circuit shown in FIG. 1.

FIG. 3 illustrates an exemplary internal configuration of the row address comparison circuit 30 shown in FIG. 1. In FIG. 3, the reference numeral 31 refers to an EXOR (exclusive or) circuit; 32 and 33 to NAND circuits; and 34, 35, 36, 37, 38, and 39 to inverters. The EXOR circuit 31 receives the A-port row address signal RAA and the B-port row address signal RAB and generates the row address disagreement signal RXOR. As mentioned above, when the equation RAA=RAB holds, RXOR=0 (at the "L" level), and when the equation RAA=RAB does not hold, RXOR=1 (at the "H" level). The NAND circuit 33 receives the word line clock signal WLCK and the row address disagreement signal RXOR and supplies the B-port word line clock signal WLCKB via the inverter 39. The logic of the A-port word line clock signal WLCKA is the same as that of the word line clock signal WLCK.

In FIG. 3, when RXOR=0, that is, when the row address comparison circuit 30 detects that the A-port row address signal RAA and the B-port row address signal RAB match each other, the row address comparison circuit 30 supplies the A-port word line clock signal WLCKA so as to operate the A-port row decoder 40, such that the A-port word line (i.e., WLA0 or WLA1) of the memory cells in the row selected according to the A-port row address signal RAA is driven, while the row address comparison circuit 30 stops the supply of the B-port word line clock signal WLCKB so as to halt the operation of the B-port row decoder 50, such that neither of the B-port word lines WLB0 and WLB1 is driven.

Figure 4:
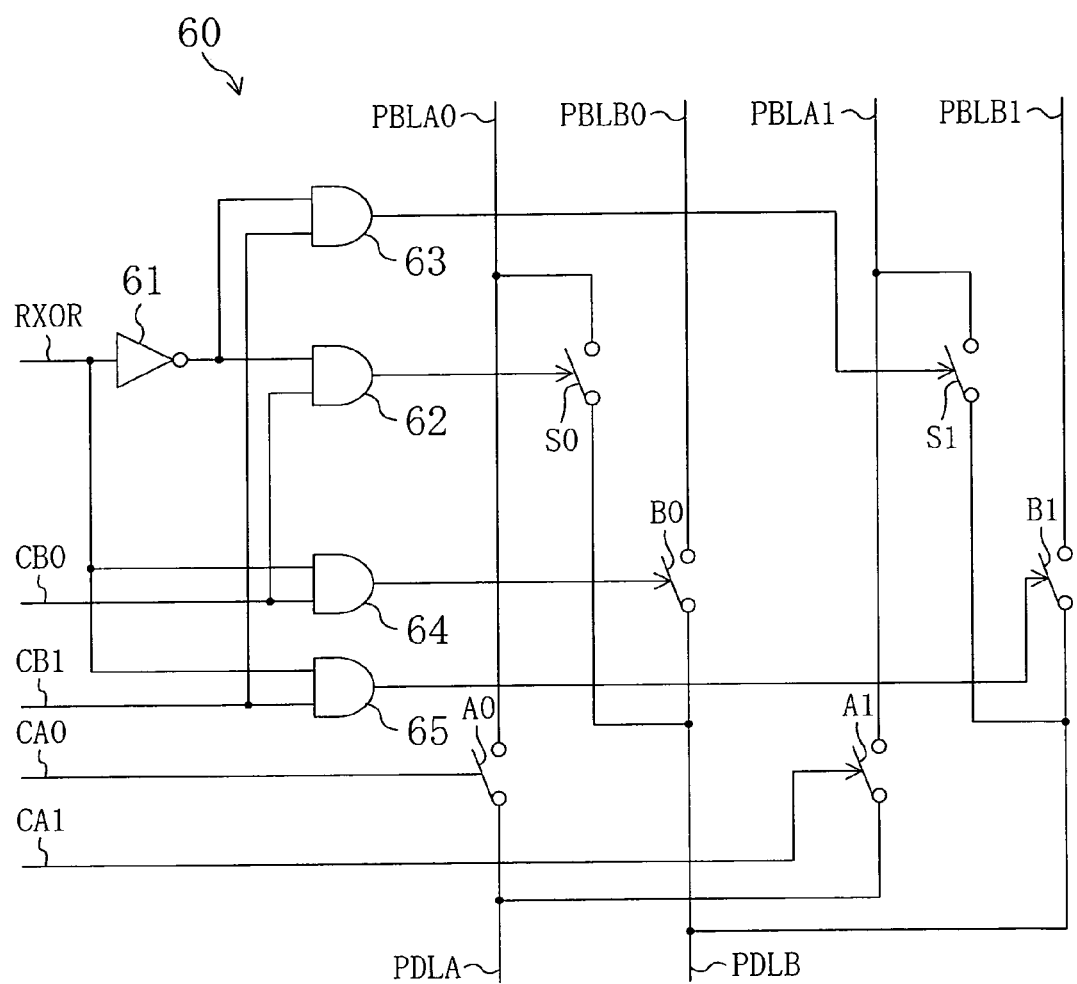
FIG. 4 is a circuit diagram illustrating the details of a column switch shown in FIG. 1.

FIG. 4 illustrates an exemplary internal configuration of the column switch 60 shown in FIG. 1. In FIG. 4, the reference numerals A0 and A1 refer to first and second A-port switches; B1 and B1 to first and second B-port switches; S0 and S1 to first and second inter-port switches; 61 to an inverter; and 62, 63, 64, and 65 to AND circuits. Each of the six switches A0, A1, B1, B1, S0, and S1 may be composed of two CMOS transfer gates and a control inverter, for example.

The first A-port switch A0, which is interposed between the A-port bit line pair PBLA0 specified by the column address 0 and the A-port data line pair PDLA, turns on, when CA0=1. The second A-port switch A1, which is interposed between the A-port bit line pair PBLA1 specified by the column address 1 and the A-port data line pair PDLA, turns on, when CA1=1. The first B-port switch B1, which is interposed between the B-port bit line pair PBLB0 specified by the column address 0 and the B-port data line pair PDLB, turns on, when the equations RXOR=1 and CB0=1 are both satisfied. The second B-port switch B1, which is interposed between the B-port bit line pair PBLB1 specified by the column address 1 and the B-port data line pair PDLB, turns on, when the equations RXOR=1 and CB1=1 both hold. The first inter-port switch S0, which is interposed between the A-port bit line pair PBLA0 specified by the column address 0 and the B-port data line pair PDLB, turns on, when the equations RXOR=0 and CB0=1 are both satisfied. The second inter-port switch S1, which is interposed between the A-port bit line pair PBLA1 specified by the column address 1 and the B-port data line pair PDLB, turns on, when the equations RXOR=0 and CB1=1 both hold. It should be noted that the on/off control systems of these six switches A0, A1, B0, B1, S0, and S1 do not differ between when data is read from the memory cell array 10 and when data is written into the memory cell array 10.

In the column switch 60 of FIG. 4, when RXOR=1, that is, when the row address comparison circuit 30 detects that the A-port row address signal RAA and the B-port row address signal RAB do not match each other, the first and second inter-port switches S0 and S1 both turn off. And the on/off of the first and second A-port switches A0 and A1 is controlled by the A-port column decode signals CA0 and CA1, while the on/off of the first and second B-port switches B0 and B1 is controlled by the B-port column decode signals CB0 and CB1. This enables the A-port and the B-port to operate simultaneously and independently of each other.

On the other hand, when RXOR=0, that is, when the row address comparison circuit 30 detects that the A-port row address signal RAA and the B-port row address signal RAB match each other, the first and second B-port switches B0 and B1 both turn off. And the first and second A-port switches A0 and A1 and the first and second inter-port switches S0 and S1 operate as described in the following (a) through (d) in accordance with a combination of the A-port column decode signals CA0 and CA1 and the B-port column decode signals CB0 and CB1.

(a) In a case where the equations CA0=1 and CB0=1 both hold.

This means that requests to read data from the memory cell (M00) 11 in the first row and the first column, for example, through each of the A-port and the B-port have been made. In this case, the first A-port switch A0 and the first inter-port switch S0 turn on, while the second A-port switch A1 and the second inter-port switch S1 turn off. As a result, the data read from the memory cell (M00) 11 in the first row and the first column into the A-port bit line pair PBLA0 specified by the column address 0 is transferred to the A-port data line pair PDLA via the first A-port switch A0, while the same data on the A-port bit line pair PBLA0 is transferred to the B-port data line pair PDLB by way of the first inter-port switch S0.

(b) In a case where the equations CA1=1 and CB1=1 both hold.

This means that requests to read data from the memory cell (M01) 12 in the first row and the second column, for example, through each of the A-port and the B-port have been made. In this case, the second A-port switch A1 and the second inter-port switch S1 turn on, while the first A-port switch A0 and the first inter-port switch S0 turn off. As a result, the data read from the memory cell (M01) 12 in the first row and the second column into the A-port bit line pair PBLA1 specified by the column address 1 is transferred to the A-port data line pair PDLA via the second A-port switch A1, while the same data on the A-port bit line pair PBLA1 is transferred to the B-port data line pair PDLB by way of the second inter-port switch S1.

(c) In a case where the equations CA0=1 and CB1=1 both hold.

This means that data in the memory cell (M00) 11 in the first row and the first column is requested to be read through the A-port and data in the memory cell (M01) 12 in the first row and the second column is requested to be read through the B-port, for example. In this case, the first A-port switch A0 and the second inter-port switch S1 turn on, while the second A-port switch A1 and the first inter-port switch S0 turn off. As a result, the data read from the memory cell (M00) 11 in the first row and the first column into the A-port bit line pair PBLA0 specified by the column address 0 is transferred to the A-port data line pair PDLA through the first A-port switch A0, while the data read from the memory cell (M01) 12 in the first row and the second column into the A-port bit line pair PBLA1 specified by the column address 1 is transferred to the B-port data line pair PDLB via the second inter-port switch S1. That is, the correct output data signals DOA and DOB are obtained for both the A-port and the B-port.

(d) In a case where the equations CA1=1 and CB0=1 both hold.

This means that data in the memory cell (M01) 12 in the first row and the second column is requested to be read through the A-port and data in the memory cell (M00) 11 in the first row and the first column is requested to be read through the B-port, for example. In this case, the second A-port switch A1 and the first inter-port switch S0 turn on, while the first A-port switch A0 and the second inter-port switch S1 turn off. As a result, the data read from the memory cell (M01) 12 in the first row and the second column into the A-port bit line pair PBLA1 specified by the column address 1 is transferred to the A-port data line pair PDLA through the first A-port switch A1, while the data read from the memory cell (M00) 11 in the first row and the first column into the A-port bit line pair PBLA0 specified by the column address 0 is transferred to the B-port data line pair PDLB via the first inter-port switch S0. That is, the correct output data signals DOA and DOB are obtained for both the A-port and the B-port.

It should be noted that the present invention is applicable to cases where the respective numbers of rows and columns in which the memory cells that form the memory cell array 10 are arranged are four or more. When the number of rows is four or more, each of the A- and B-port row address signals becomes 2 bits or more, and thus the number of input bits to the EXOR circuit 31 of FIG. 3 may be increased accordingly. Also, in a case where the number of columns is four or more, the respective numbers of A-port column decode signals and B-port column decode signals become four or more. According to this, the respective numbers of A-port switches A0 and A1, B-port switches B0 and B1, and inter-port switches S0 and S1 shown in FIG. 4 may be increased to four or more, and the number of AND circuits 62 through 65 may be increased accordingly.

A sense amplifier may be provided for each of the A-port bit line pairs PBLA0 and PBLA1 and the B-port bit line pairs PBLB0 and PBLB1, which are shared by the memory cells in the corresponding columns in the memory cell array 10. However, the sense amplifier circuit 70 can have a smaller size, when the memory device is configured as shown in FIG. 1 in which a sense amplifier is provided for each of the A-port data line pair PDLA and the B-port data line pair PDLB, which are shared by all of the columns in the memory cell array 10.

Furthermore, the present invention is applicable to a multiport semiconductor memory device having three or more ports. In the case of a three-port SRAM having three ports A, B and C, for instance, in addition to a result of comparison between an A-port row address signal and a B-port row address signal, comparison results between the B-port row address signal and a C-port row address signal and between the C-port row address signal and the A-port row address signal may be used.

As described in the foregoing, in the semiconductor memory device of the present invention, it is ensured that correct data is always output, while decrease in data read speed and malfunctions are prevented, and thus the inventive semiconductor memory device is applicable to cache memories in microprocessors or the like.

What is claimed is:

1. A semiconductor memory device comprising:
a memory cell array in which a plurality of memory cells are arranged two-dimensionally in a plurality of rows and a plurality of columns, each of the memory cells having first- and second-port word lines and first- and second-port bit line pairs;
a first row decoder for driving the first-port word line of memory cells in a row selected from the plurality of rows in the memory cell array according to a first-port row address;
a second row decoder for driving the second-port word line of memory cells in a row selected from the plurality of rows in the memory cell array according to a second-port row address;
a row address comparison circuit for detecting whether or not the first-port row address and the second-port row address match each other and controlling the first and second row decoders in such a manner that when it is detected that the first-port and second-port row addresses do not match each other, the first and second row decoders are both operated, and when it is detected that the first-port and second-port row addresses match each other, only the first row decoder is operated; and a column switch interposed between a set of the first-port bit line pairs and the second-port bit line pairs, each of which is shared by memory cells in a corresponding one of the columns in the memory cell array, and a set of a first-port data line pair and a second-port data line pair, each of which is shared by the columns in the memory cell array, wherein when the row address comparison circuit detects that the first-port row address and the second-port row address do not match each other, the column switch connects, to the first-port data line pair, the first-port bit line pair of memory cells in a column selected from the plurality of columns in the memory cell array according to the first-port column address, and connects, to the second-port data line pair, the second-port bit line pair of memory cells in a column selected from the plurality of columns in the memory cell array according to the second-port column address, and when the row address comparison circuit detects that the first-port row address and the second-port row address match each other, the column switch connects, to the first-port data line pair, the first-port bit line pair of the memory cells in the column selected from the plurality of columns in the memory cell array according to the first-port column address, and connects, to the second-port data line pair, the first-port bit line pair of the memory cells in the column selected from the plurality of columns in the memory cell array according to the second-port column address.

2. The device of claim 1, wherein upon detecting that the first-port row address and the second-port row address match each other, the row address comparison circuit stops supply of a word line clock signal to the second row decoder, thereby halting operation of the second row decoder.

3. The device of claim 1, wherein the column switch includes:
- a set of first-port switches each interposed between a corresponding one of the first-port bit line pairs, which is shared by the memory cells in the corresponding column in the memory cell array, and the first-port data line pair;
- a set of second port switches each interposed between a corresponding one of the second-port bit line pairs, which is shared by the memory cells in the corresponding column in the memory cell array, and the second-port data line pair; and
- a set of inter-port switches each interposed between a corresponding one of the first-port bit line pairs, which is shared by the memory cells in the corresponding column in the memory cell array, and the second-port data line pair.

* * * * *